US009024365B2

United States Patent
Chen et al.

(10) Patent No.: US 9,024,365 B2
(45) Date of Patent: May 5, 2015

(54) HIGH VOLTAGE JUNCTION FIELD EFFECT TRANSISTOR AND MANUFACTURING METHOD THEREOF

(75) Inventors: Li-Fan Chen, Hsinchu (TW); Wing-Chor Chan, Hsinchu (TW); Jeng Gong, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 88 days.

(21) Appl. No.: 13/608,260

(22) Filed: Sep. 10, 2012

(65) Prior Publication Data

US 2014/0070281 A1 Mar. 13, 2014

(51) Int. Cl.
*H01L 29/08* (2006.01)
*H01L 29/808* (2006.01)
*H01L 29/06* (2006.01)
*H01L 29/10* (2006.01)

(52) U.S. Cl.
CPC .......... *H01L 29/808* (2013.01); *H01L 29/0634* (2013.01); *H01L 29/0692* (2013.01); *H01L 29/1066* (2013.01)

(58) Field of Classification Search
CPC .............. H01L 29/808; H01L 29/1066; H01L 29/0692; H01L 29/0634
USPC ......... 257/504, 287, 200, 256, 264, 272, 273, 257/285, 325, 342, 343, 500; 438/188, 189, 438/197
See application file for complete search history.

(56) References Cited

U.S. PATENT DOCUMENTS

| 5,012,305 A * | 4/1991 | Khadder et al. ............... 257/270 |
| 2008/0093700 A1 * | 4/2008 | Huang ........................... 257/500 |
| 2008/0299716 A1 | 12/2008 | Hower et al. |
| 2011/0042726 A1 * | 2/2011 | Banerjee et al. ............... 257/272 |

FOREIGN PATENT DOCUMENTS

TW 201222817 A1 6/2012

OTHER PUBLICATIONS

TW Office Action dated Jul. 29, 2014.

* cited by examiner

*Primary Examiner* — Kyoung Lee
*Assistant Examiner* — Ratisha Mehta
(74) *Attorney, Agent, or Firm* — McClure, Qualey & Rodack, LLP

(57) ABSTRACT

A high voltage junction field effect transistor and a manufacturing method thereof are provided. The high voltage junction field effect transistor includes a base, a drain, a source and a P type top layer. The drain and the source are disposed above the base. A channel is formed between the source and the drain. The P type top layer is disposed above the channel.

20 Claims, 4 Drawing Sheets

US 9,024,365 B2

HIGH VOLTAGE JUNCTION FIELD EFFECT TRANSISTOR AND MANUFACTURING METHOD THEREOF

FIELD OF THE INVENTION

The invention relates in general to a junction field effect transistor and manufacturing method thereof, and more particularly to a high voltage junction field effect transistor and manufacturing method thereof.

DESCRIPTION OF THE RELATED ART

With the development of semiconductor technology, a junction field effect transistor (JFET) is wide used in varied electrical product.

In a JFET, a channel is formed between a drain and a source. Two gates are disposed at two sides of the channel. The size of a depletion region is controlled by the voltage of the gates, such that the channel can be pitched off and turned off.

The JFET can be used as a fixed current diode or a fixed resistance. Or, the JFET can be used for modulating the voltage in low frequency signal or high frequency signal.

With the development of high voltage semiconductor technology, a high voltage junction field effect transistor (HV JFET) is invented. The researchers try to improve the performance of the HV JFET.

SUMMARY OF THE INVENTION

The invention is directed to a high voltage junction field effect transistor and a manufacturing method thereof. A P type top layer is used to prevent a surface leaking current and to reduce a breakdown voltage of a high voltage junction field effect transistor.

According to a first aspect of the present invention, a high voltage junction field effect transistor is provided. The high voltage junction field effect transistor includes a base, a drain, a source and a P type top layer. The drain and the source are disposed above the base. A channel is formed between the source and the drain. The P type top layer is disposed above the channel.

According to a second aspect of the present invention, a manufacturing method of the high voltage junction field effect transistor is provided. The manufacturing method of the high voltage junction field effect transistor comprises the following steps. A base is provided. A drain is formed above the base. The source is formed above the base. A channel is formed between the source and the drain. A P type top layer is formed above the channel.

The invention will become apparent from the following detailed description of the preferred but non-limiting embodiments. The following description is made with reference to the accompanying drawings.

DETAILED DESCRIPTION OF THE INVENTION

Preferred embodiments are disclosed below for elaborating the invention. A P type top layer is used to prevent a surface leaking current and to reduce a breakdown voltage of a high voltage junction field effect transistor. The following embodiments are for the purpose of elaboration only, not for limiting the scope of protection of the invention. Besides, secondary elements are omitted in the following embodiments to highlight the technical features of the invention.

First Embodiment

Figure 1:
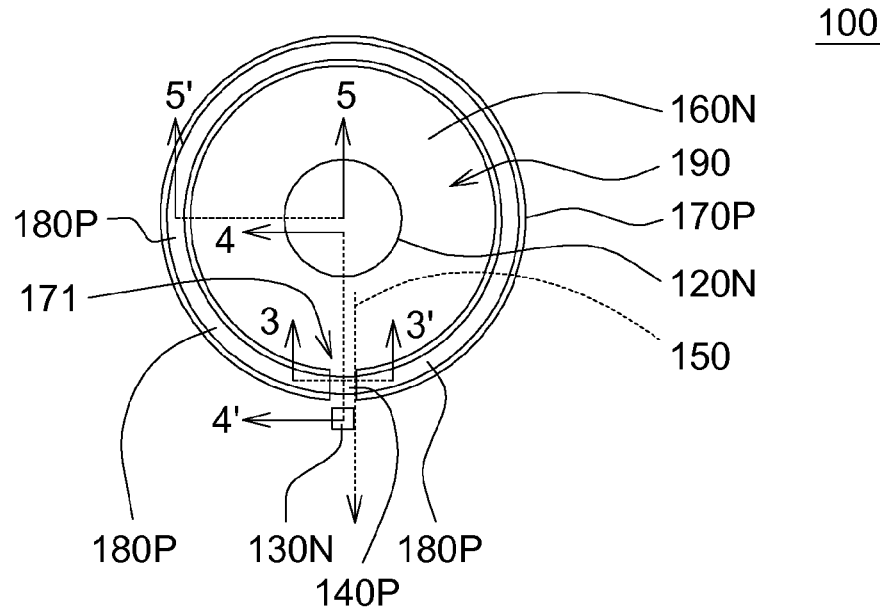
FIG. 1 shows a top view of a high voltage junction field effect transistor according to a first embodiment.

Please referring to FIG. 1, FIG. 1 shows a top view of a high voltage junction field effect transistor 100 according to a first embodiment. The high voltage junction field effect transistor 100 includes a base 110P (shown in FIG. 5), a drain 120N, a source 130N and a P type top layer 140P. The drain 120N and the source 130N are disposed above the base 110P. A channel 150 is formed between the source 130N and the drain 120N. The P type top layer 140P is disposed above the channel 150. When the channel 150 is turned off, the P type top layer 140P can prevent surface leaking current.

Figure 2:
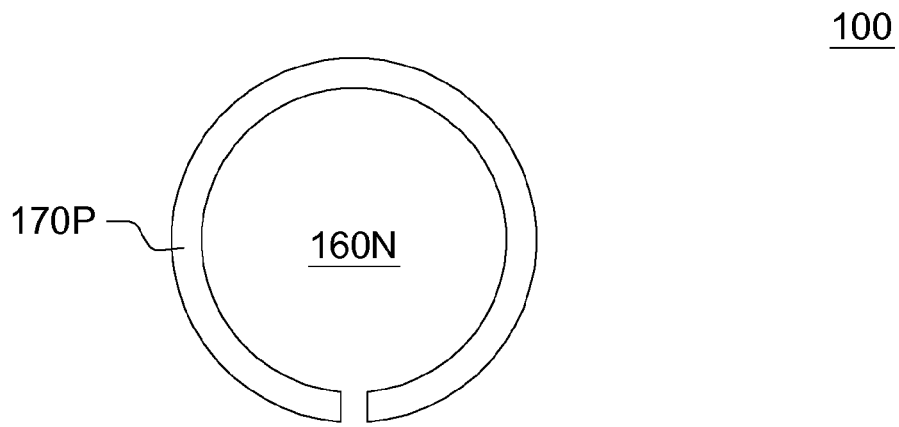
FIG. 2 shows an N type well and a P type well of the high voltage junction field effect transistor of FIG. 1.

Please referring to FIGS. 1 to 2, FIG. 2 shows an N type well 160N and a P type well 170P of the high voltage junction field effect transistor 100 of FIG. 1. The high voltage junction field effect transistor 100 further includes an N type well 160N, two P type wells 170P and two gates 180P. The relationship between the N type well 160N and the P type wells 170P can be clear understood according to FIG. 2. The P type wells 170P and the N type well 160N are disposed on the base 110P. Because the base 110P is located below the N type well 160N and the P type wells 170P, the base 110P is shown by dotted line. In the present embodiment, the base 110P and the P type wells 170P are P type, and the N type well 160N is N type.

Referring to FIG. 1, the source 130N and the drain 120N are disposed in the N type well 160N. The channel 150 is formed in the N type well 160N. In the present embodiment, the source 130N and the drain 120N are N heavily doping layers. The gates 180P are disposed in the P type wells 170P. In the present embodiment, the gates 180P are P type heavily doping layers.

Figure 3:
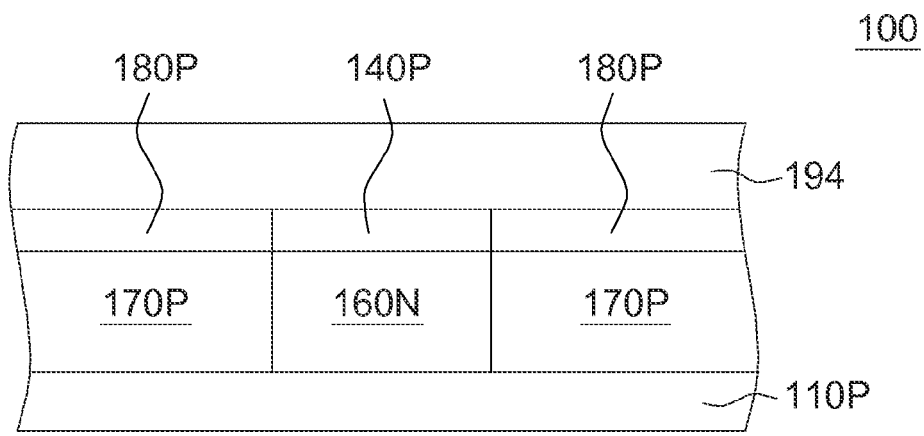
FIG. 3 shows a cross-section view along the cross-section line 3-3' of the high voltage junction field effect transistor of FIG. 1.

Please referring to FIG. 3, a cross-section view along the cross-section line 3-3' of the high voltage junction field effect transistor of FIG. 1 is shown. Referring to FIG. 3, the P type wells 170P are disposed at two sides of the N type well 160N, such that a depletion region is formed. The size of the depletion region is related to a reverse voltage. If the size of the depletion region is large, the channel 150 (shown in FIG. 1) will be pinched off. The N type well 160N shown in FIG. 3 is part of the channel 150. The P type top layer 140P is disposed above the channel 150. The P type top layer 140P can prevent surface leaking current flowing through the surface of the N type well 160N, and improve the breakdown voltage of the high voltage junction field effect transistor 100.

Please referring to FIG. 2, the P type wells 170P are arranged along an annular line and are connected to form a C shaped structure. The annular line surrounds the N type well 160N. Referring to FIG. 1, the drain 120N is located at a geometry center of the annular line, and the source 130N is located at outside of the annular line. A drift region 190 is formed between the P type wells 170P. The drift region 190 is used to help the high voltage junction field effect transistor 100 working in high voltage.

Referring to FIG. 1, the C shaped structure has an opening 171. The P type top layer 140P is disposed at the opening 171. The source 130N is disposed at the outside of the opening 171. At the opening 171, the channel 150 is located between the P type wells 170P, such that the channel 150 can be pinched off at the opening 171. In the present embodiment, the P type top layer 140P is disposed at the opening 171. When the channel 150 is pinched off, any surface leaking current will not flow through the surface at the opening 171.

Figure 4:
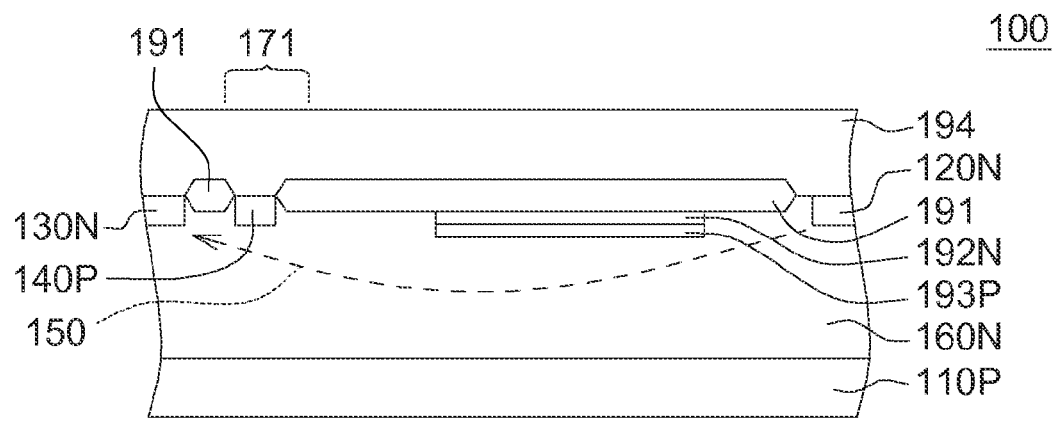
FIG. 4 shows a cross-section view along the cross-section line 4-4' of the high voltage junction field effect transistor of FIG. 1.

Moreover, referring to FIG. 4, the high voltage junction field effect transistor 100 further includes a plurality of field oxides 191, an N type adjusting layer 192N and a P type adjusting layer 193P. To simple the drawing, the field oxides 191 are not shown in FIG. 1. The field oxides 191 are used for isolating the drain 120N, the P type top layer 140P and the source 130N. An N type adjusting layer 192N and a P type adjusting layer 193P are disposed in the N type well 160N, and located below the field oxide 191. The P type adjusting layer 193P is located below the N type adjusting layer 192N. The channel 150 can slightly shift downward to being far from the surface of the N type well 160N. Therefore, the breakdown voltage of the high voltage junction field effect transistor 100 can be improved.

Please referring to FIG. 4, a cross-section view along the cross-section line 4-4' of the high voltage junction field effect transistor 100 of FIG. 1 is shown. The cross-section line 4-4' is drawn from the drain 120N to the source 130N and passes through the opening 171. As shown in FIG. 4, the channel 150 is formed between the drain 120N and the source 130N in the N type well 160N. The channel 150 will be pinched off at the opening 171. The P type top layer 140P is disposed on the channel 150, such that when the channel 150 is pinched off, any leaking current will not flow through the surface at the opening 171.

Moreover, referring to FIG. 4, the high voltage junction field effect transistor 100 further includes a plurality of field oxides 191, an N type adjusting layer 192N and a P type adjusting layer 193P. To simple the drawing, the field oxides 191 are not shown in FIG. 1. The field oxides 191 are used for isolating the drain 120N, the P type top layer 140P and the source 130N. An N type adjusting layer 192N and a P type adjusting layer 193P are disposed in the N type well 160N, and located below the field oxide 191. The P type adjusting layer 193P is located below the N type adjusting layer 192N. The channel 150 can slightly shift downward to being far from the surface of the N type well 160N. Therefore, the breakdown voltage of the high voltage junction field effect transistor 100 can be improved.

Figure 5:
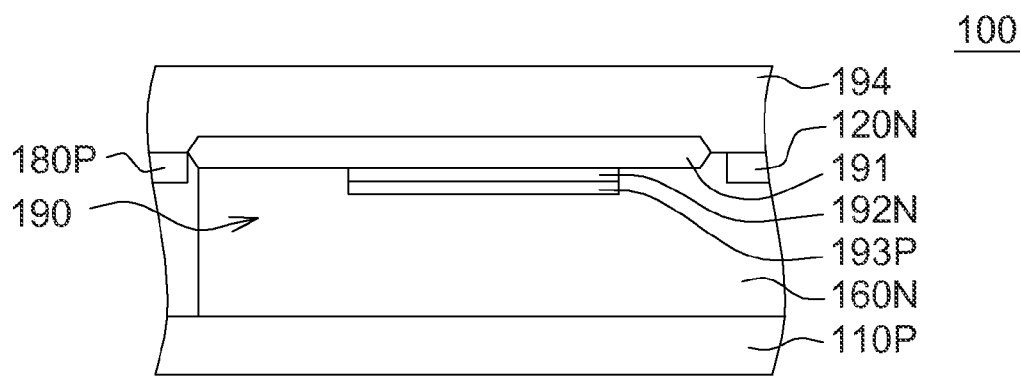
FIG. 5 shows a cross-section view along the cross-section line 5-5' of the high voltage junction field effect transistor of FIG. 1.

Please referring to FIG. 5, a cross-section view along the cross-section line 5-5' of the high voltage junction field effect transistor 100 of FIG. 1 is shown. The cross-section line 5-5' is drawn from the drain 120N to the gate 180P and does not passes through the opening 171. As shown in FIG. 5, the field oxide 191 is used for isolating the drain 120N and the gate 180P. The N type adjusting layer 192N and the P type adjusting layer 193P are disposed in the N type well 160N and located below the field oxide 191. The drift region 190 is formed between the drain 120N and the gate 180P to help the high voltage junction field effect transistor 100 working in high voltage.

Regarding the manufacturing method of the high voltage junction field effect transistor 100, the method is illustrated by FIGS. 3 to 4. Referring to FIG. 3, the base 110P is provided. Then, the N type well 160N and the P type well 170P are formed in the base 110P.

Afterwards, referring to FIG. 4, the P type adjusting layer 193P and the N type adjusting layer 192N are formed in the N type well 160N. Then, the field oxides 191 are formed.

Then, referring to FIG. 4, N type material is doped to form the drain 120N and the source 130N. Afterwards, referring to FIG. 4, P type material is doped to form the gates 180P (shown in FIG. 3) and the P type top layer 140P. The step of doping the N type material and the step of doping the P type material can be changed according to the design requirement.

Afterwards, referring to FIG. 3, an insulating layer 194 is formed to cover the N type well 160N and the P type well 170P. After performing the above steps, the high voltage junction field effect transistor 100 is formed.

Moreover, the high voltage junction field effect transistor 100 of the present embodiment not only can prevent any leaking current flowing through the surface of the base 110P and improve the breakdown voltage, but also can be applied in the local oxidation of silicon (LOCOS) process, the shallow trench isolation (STI) process, the deep trench isolation (DTI) process, the silicon-on insulator process and the EPI process.

Second Embodiment

Figure 6:
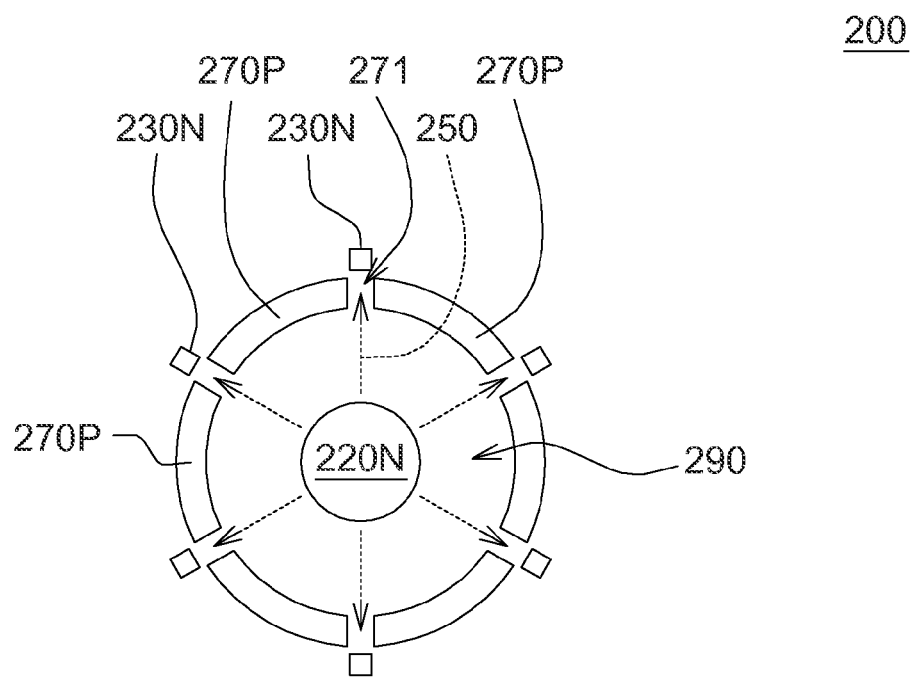
FIG. 6 shows a top view of a high voltage junction field effect transistor according to a second embodiment.

Please referring to FIG. 6, a top view of a high voltage junction field effect transistor 200 according to a second embodiment is shown. The high voltage junction field effect transistor 200 of the present embodiment and the high voltage junction field effect transistor 100 of the first embodiment are different in the number of the channels 250, other similarities would not be repeated.

Referring to FIG. 6, six P type wells 270P are separated by six openings 271. The P type wells 270P are symmetrically arranged along an annular line. The openings 271 are symmetrically arranged along the annular line, too.

The six sources 230N are disposed at the outside of the openings 271. Six channels 250 are formed between a drain 220N and the six sources 230N. The channels 250 pass through the drift region 290. The sources 230N are electrically connected to the same terminal. The breakdown voltages of the channels 250 are substantially equal. The sum of the breakdown voltage of the six channels 250 is the breakdown voltage of the high voltage junction field effect transistor 200.

Third Embodiment

Figure 7:
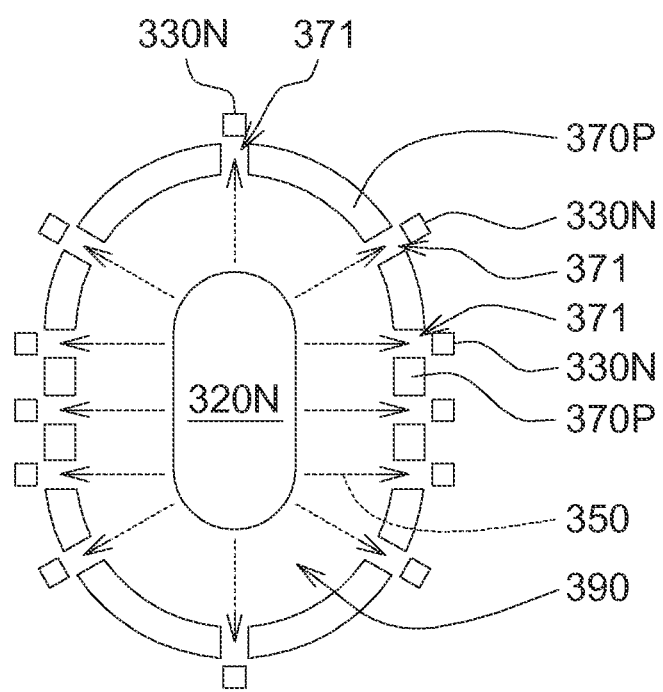
FIG. 7 shows a top view of a high voltage junction field effect transistor according to a third embodiment.

Please referring to FIG. 7, a top view of a high voltage junction field effect transistor 300 according to a third embodiment is shown. The high voltage junction field effect transistor 300 of the present embodiment and the high voltage junction field effect transistor 200 of the second embodiment are different in the arrangement and the number of the channels 350, other similarities would not be repeated.

Referring to FIG. 7, the twelve P type wells 370P are separated by the twelve openings 371. The P type wells 370P are symmetrically arranged along an annular line. The openings 371 are symmetrically arranged along the annular line, too. In the present embodiment, the annular line is substantially oval-shaped.

The twelve sources 330N are disposed at the outside of the openings 371. Twelve channels 350 are formed between a drain 320N and the twelve sources 330N. The channels 350 pass through the drift region 390. The sources 330N are electrically connected to the same terminal. The breakdown voltages of the channels 350 are substantially equal. The sum of the breakdown voltage of the twelve channels 350 is the breakdown voltage of the high voltage junction field effect transistor 300.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A high voltage junction field effect transistor, comprising:
   a base;
   a drain, disposed above the base;
   a source, disposed above the base, a channel is formed between the source and the drain;
   a P type top layer, disposed above the channel; and
   two gates, adjacent to the P type top layer, wherein a bottom of each gate and a bottom of the P type top layer are located at the same level above the channel.

2. The high voltage junction field effect transistor according to claim 1,
   wherein the two gates are disposed at two sides of the channel.

3. The high voltage junction field effect transistor according to claim 1, wherein the base is P type, and the high voltage junction field effect transistor further comprises:
   an N type well, disposed on the base, wherein the source and the drain are disposed in the N type well; and
   two P type wells, disposed at two sides of the N type well.

4. The high voltage junction field effect transistor according to claim 3, wherein the P type top layer is disposed on the N type well.

5. The high voltage junction field effect transistor according to claim 3, wherein the P type wells are connected with each other.

6. The high voltage junction field effect transistor according to claim 3, wherein the P type wells are arranged along an annular line, and the annular line surrounds the N type well.

7. The high voltage junction field effect transistor according to claim 6, wherein the drain is disposed at a geometry center of the annular line.

8. The high voltage junction field effect transistor according to claim 6, wherein the source is disposed at outside of the annular line.

9. The high voltage junction field effect transistor according to claim 6, wherein the P type wells are arranged along the annular line to form a C shaped structure, the C shaped structure has an opening, and the P type top layer is disposed at the opening.

10. The high voltage junction field effect transistor according to claim 9, wherein the source is disposed at the outside of the opening.

11. A manufacturing method of a high voltage junction field effect transistor, comprising:
    providing a base;
    forming a drain above the base;
    forming a source above the base, wherein a channel is formed between the source and the drain;
    forming a P type top layer above the channel; and
    forming two gates adjacent to the P type top layer, wherein a bottom of each gate and a bottom of the P type top layer are located at the same level above the channel.

12. The manufacturing method of the high voltage junction field effect transistor according to claim 11,
    wherein the two gates are formed at two sides of the channel.

13. The manufacturing method of the high voltage junction field effect transistor according to claim 11, wherein the base is P type, and the manufacturing method of the high voltage junction field effect transistor further comprises:
    forming an N type well on the base, wherein the source and the drain are disposed in the N type well; and
    forming two P type wells at two sides of the N type well.

14. The manufacturing method of the high voltage junction field effect transistor according to claim 13, wherein the P type top layer is disposed on the N type well.

15. The manufacturing method of the high voltage junction field effect transistor according to claim 13, wherein the P type wells are connected with each other.

16. The manufacturing method of the high voltage junction field effect transistor according to claim 13, wherein the P type wells are arranged along an annular line, and the annular line surrounds the N type well.

17. The manufacturing method of the high voltage junction field effect transistor according to claim 16, wherein the drain is disposed at a geometry center of the annular line.

18. The manufacturing method of the high voltage junction field effect transistor according to claim 16, wherein the source is disposed at outside of the annular line.

19. The manufacturing method of the high voltage junction field effect transistor according to claim 16, wherein the P type wells are arranged along the annular line to form a C shaped structure, the C shaped structure has an opening, and the P type top layer is disposed at the opening.

20. The manufacturing method of the high voltage junction field effect transistor according to claim 19, wherein the source is disposed at the outside of the opening.

* * * * *